(12) United States Patent
Haiut

(10) Patent No.: US 7,292,109 B2
(45) Date of Patent: Nov. 6, 2007

(54) AUTO-CALIBRATED TIME BASE APPARATUS, SYSTEMS, AND METHODS

(75) Inventor: Moshe Haiut, Ramat-Gan (IL)

(73) Assignee: Intel Corporation, Santa Clara, CA (US)

( * ) Notice: Subject to any disclaimer, the term of this patent is extended or adjusted under 35 U.S.C. 154(b) by 151 days.

(21) Appl. No.: 11/238,633

(22) Filed: Sep. 29, 2005

(65) Prior Publication Data

US 2007/0069827 A1    Mar. 29, 2007

(51) Int. Cl.
*G01R 23/00* (2006.01)
(52) U.S. Cl. .......................................... 331/44; 331/57
(58) Field of Classification Search ................ 331/1 A, 331/16, 44, 57, 179
See application file for complete search history.

(56) References Cited

U.S. PATENT DOCUMENTS

2007/0069827 A1*  3/2007  Haiut .......................... 331/57

OTHER PUBLICATIONS

"Ring Oscillator", [online]. [retrieved on Apr. 16, 2007]. Retrieved from the Internet: <URL: http://tams-www.informatik.uni-hamburg.de/applets/hades/webdemos/12-gatedelay/20-ringoscillator/ringoscillator.html>, 2 pgs.
Appel, G., "RF Signal Processing—Fractional n Synthesizers", [online]. [archived on Jul. 25, 2004]. Retrieved from the Internet: <URL: http://web.archive.org/ web/20040725050920/http://images.rfdesign.com/files/4/1100Appel34.pdf>, (Nov. 2000), 34-50.
Haiut, M., "Temperature Compensated Crystal Oscillator", U.S. Appl. No. 11/323,822, filed Dec. 29, 2005.

* cited by examiner

*Primary Examiner*—David Mis
(74) *Attorney, Agent, or Firm*—Schwegman, Lundberg & Woessner, P.A.

(57) ABSTRACT

Apparatus, systems, methods, and articles may divide a frequency associated with an output of an oscillator formed in a semiconductor substrate using a programmable fractional-N divider module (PFNDM) coupled to the oscillator. A calibration module may be coupled to the PFNDM to select the division ratio to yield a first clock signal of an estimated frequency. Other embodiments may be described and claimed.

30 Claims, 3 Drawing Sheets

AUTO-CALIBRATED TIME BASE APPARATUS, SYSTEMS, AND METHODS

TECHNICAL FIELD

Various embodiments described herein relate to digital communications generally, including apparatus, systems, and methods used to compensate an on-die oscillator time base to obtain a clock signal of a selected stability.

BACKGROUND INFORMATION

As communications processors and wireless mobile devices incorporating such processors become increasingly complex, power consumption may increase. Sleep modes of operation and base station paging protocols have been developed to conserve battery power. Transmissions between the mobile device and a base station may be suspended during a period of sleep-mode operation. The mobile device may wake up every few seconds according to the paging protocols to engage in active communication with the base station. Data or incoming calls may be transferred to the mobile device during these wakeful periods.

Accurate time interval measurements may be required while a wireless mobile device is in sleep mode. The wireless mobile device may require at least one time base in order to perform the time interval measurements and to establish communication according to the paging protocols. The time base may comprise a crystal oscillator-based clock local to the device. The clock may be locked onto a remote time base associated with the base station during periods of active communication. In order to maintain synchronization with the base station, the wake-up timing may require a particular accuracy, perhaps to a few microseconds.

Thus, a time base with an accuracy of a few parts per million (PPM) may be required to be active during sleep-mode periods. Some wireless mobile devices may use a time base other than a main crystal oscillator to maintain the sleep-mode time base. The high frequency of operation associated with the main crystal oscillator (e.g., 26 MHz in a cellular telephone) may result in an unacceptable level of power consumption during the sleep-mode period. A lower-frequency crystal oscillator capable of continuous operation with a small battery drain, including perhaps a 32.768 KHz oscillator, may be used instead. However the lower-frequency oscillator may be less accurate than the higher-frequency main oscillator.

At the start of a paging frame the wireless mobile device may be powered on, with both clocks active. At the end of the paging frame, before entering sleep mode, the device may store in memory a number of fast clock cycles counted from the beginning of the paging frame until the closest edge of the slow clock. This may enable the device, upon wake-up, to calculate a number of fast clock periods which, when added to an edge of the slow clock, cause the edge of the slow clock to occur at the beginning of a next paging frame. That is, the wireless mobile device may wake up and begin using the main oscillator some time before the start of a paging frame. Likewise, the device may continue to use the more accurate main oscillator for some period of time following the end of the paging frame, before entering sleep mode. The accuracy associated with the main oscillator may thus be blended with the accuracy associated with the lower-frequency oscillator to yield an overall accuracy during a period of time.

The lower frequency crystal oscillator may be used as both a sleep-mode system clock and as a real-time clock (RTC). Implementing the sleep-mode clock with the lower frequency crystal oscillator may incur substantial cost, however, since discrete components including the crystal may be used in these designs.

DETAILED DESCRIPTION

Figure 1:
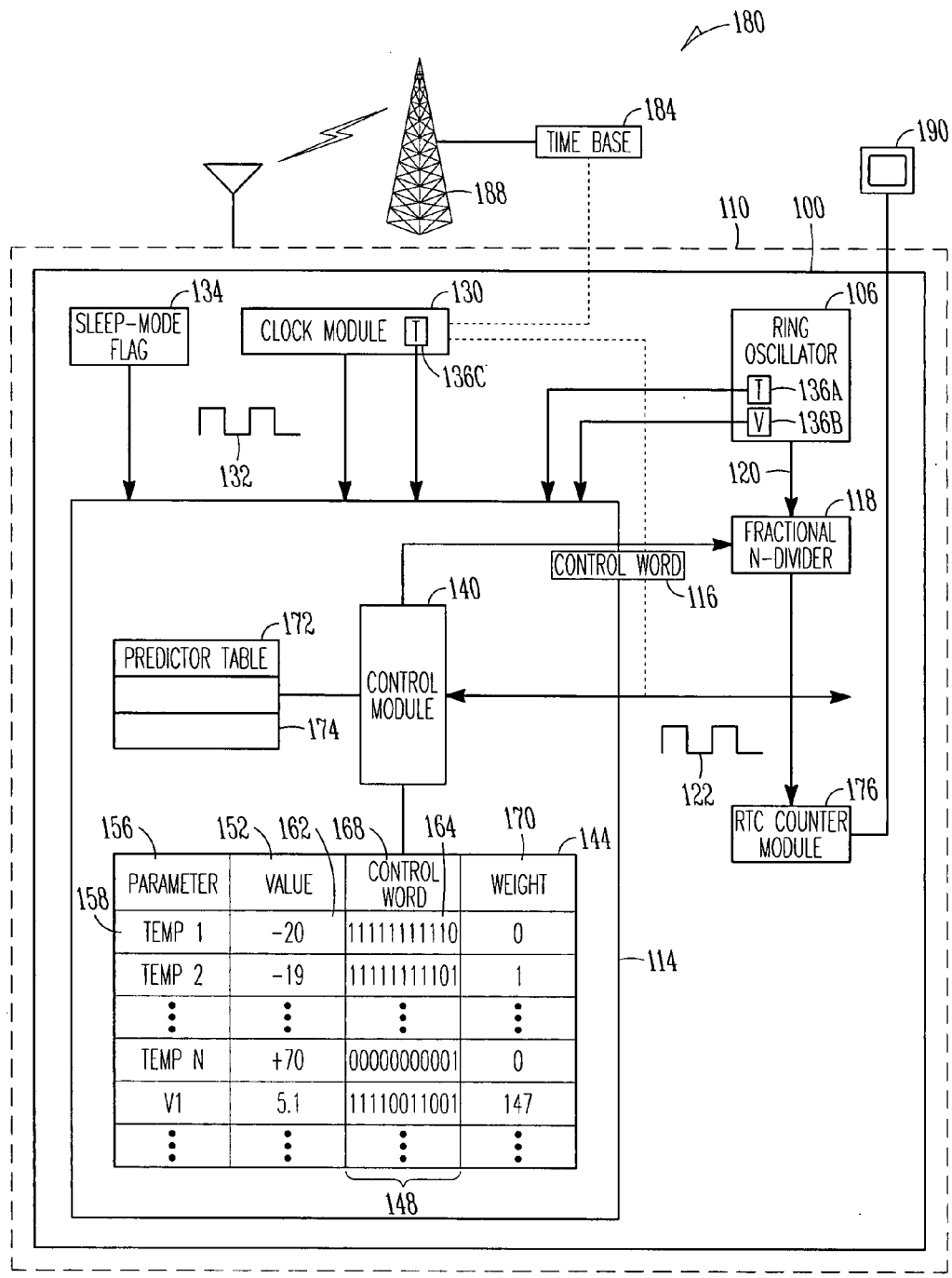
FIG. 1 is a block diagram of an apparatus and a representative system according to various embodiments of the invention.

FIG. 1 comprises a block diagram of an apparatus 100 and a system 180 according to various embodiments of the invention. Some embodiments may utilize an oscillator fabricated on a semiconductor die, including perhaps a ring oscillator 106. The oscillator may be used to derive a clock used by an electronic device, including perhaps a digital communication device. The digital communication device may comprise a wireless mobile device 110. The clock may be used for time interval measurements while the mobile device 110 is in a sleep mode. Although various embodiments disclosed herein may refer to a ring oscillator, it is noted that some embodiments of the invention may utilize other types of on-die oscillators that do not require an external crystal for their operation.

A frequency deviation associated with the ring oscillator 106 may be large, and may vary as a function of a temperature of operation and of operational voltages associated with the ring oscillator, among other factors. A base frequency associated with a particular ring oscillator or batch of ring oscillators may depend upon semiconductor process variables associated with the particular ring oscillator or with the batch. Some embodiments may utilize a calibration module 114 to record instances of the temperature of operation and of the operational voltages and to derive relationships between these parameters, a ring oscillator output frequency, and a main oscillator frequency.

These parameters and their relationships may be used to derive or update a control word 116. The control word 116 may be presented to a programmable fractional-N divider module (PFNDM) 118. The output from the PFNDM 118 may be used by the wireless mobile device 110 as a 32.768 KHz sleep-mode system clock, or as a system clock of other suitable frequency. Doing so may preclude the need for an external 32 KHz crystal, and may thereby reduce a materials cost. Some embodiments of the invention may utilize the apparatus 100 to calibrate the sleep-mode clock to a precision reference time base 184, including perhaps a clock associated with a base station 188. The calibration may occur between sleep periods. The wireless mobile device 110 may turn on its receiver, synchronize on the timing of data symbols received from the base station 188, and correct the main oscillator frequency accordingly. This may conserve processing resources associated with a communications processor that might otherwise expend the resources to perform the calibration function.

The ring oscillator 106, PFNDM 118, and calibration module 114 may be active during a sleep-mode period, since rapid changes in the semiconductor die may occur during the sleep-mode period. During wakeful periods, some embodiments may measure a frequency difference between the ring oscillator output frequency and a main crystal frequency. Some embodiments may utilize adaptive learning techniques to learn and predict the frequency deviation of the ring oscillator 106 as a function of temperature and voltage variations. Batch-to-batch semiconductor process variations may also be considered, as previously mentioned. The adaptive learning processes may occur within the calibration module 114.

Some embodiments may implement an RTC using the output from the PFNDM 118. In order to prevent a large cumulative error in the RTC during a time when the mobile device is powered off, it may be desirable that a calibrated output from the PFNDM 118 be accurate to about 10 PPM or better. The calibration module 114 may include a long-term adaptation capability to accomplish this goal. The calibration module 114 may incorporate a non-volatile memory to store control words derived as previously described. Operating parameters measured during a period of sleep-mode operation or during the power-off period may be used to index the control words from the non-volatile memory to control the PFNDM 118 during these periods.

The apparatus 100 may thus include the ring oscillator 106, formed perhaps in a semiconductor substrate. A frequency deviation of an output clock signal 120 associated with the ring oscillator 106 over an operational range of temperature measured at the semiconductor substrate may be less than about 50%. The operational range of temperature at the semiconductor substrate may comprise about minus twenty degrees Celsius to about plus seventy degrees Celsius in some embodiments.

The PFNDM 118 may be coupled to the ring oscillator to frequency-divide the output clock signal 120. The calibration module 114 may be coupled to the PFNDM 118 to select a division ratio associated with the PFNDM 118 such that an output of the PFNDM 118 comprises a first clock signal 122 of an estimated frequency. The PFNDM 118 and the calibration module 114 may be coupled together open loop, perhaps during a first period of time, to set the estimated frequency. The frequency may be estimated to result from the ring oscillator output clock signal 120 after dividing the later by the division ratio. This configuration may be referred to as an "open loop configuration."

The apparatus 100 may also include a clock module 130 coupled to the calibration module 114 to be used as a timing reference input to the division ratio control operation. A second clock signal 132 comprising an output of the clock module 130 may be available to the calibration module 114 during a second period of time. The division ratio may be selected to be a function of a frequency difference between the first clock signal 122 and the second clock signal 132. The function may be selected to drive a frequency associated with the first clock signal 122 toward a frequency associated with the second clock signal 132. The first clock signal 122 may thus be frequency-locked to the second clock signal 132 during the second period of time. This configuration may be referred to herein as a "first closed-loop configuration."

The clock module 130 may be coupled to the precision reference time base 184 to lock the second clock signal 132 to the precision reference time base 184 during a third period of time. "Precision" in the context of embodiments herein means that the precision reference time base 184 is at least an order of magnitude more precise than the second clock signal 132. A sleep-mode flag 134 may be reset to indicate to the calibration module 114 that the second clock signal 132 is locked to the precision reference time base 184. The first clock signal 122 may also be locked to the precision reference time base 184 during the third period of time, if the first clock signal 122 is locked to the second clock signal 132 during the third period of time. This configuration may be referred to herein as a "second closed-loop configuration."

The apparatus 100 may also include one or more environmental parameter sensors 136A, 136B, and 136C coupled to the calibration module 114 to sense one or more environmental parameters related to the frequency of the first clock signal 122. The sensor(s) may be coupled to the ring oscillator 106, to the clock module 130, or to other areas of the apparatus 100. A first temperature sensor 136A may, for example, sense a first temperature at a semiconductor substrate associated with the ring oscillator 106. In another example, a second temperature sensor 136C may sense a second temperature at a frequency-determining element (e.g., a crystal) associated with the clock module 130. The sensor(s) may also be coupled to the calibration module 114 to provide an input to the division ratio control operation performed by the calibration module 114. The apparatus 100 may include environmental parameter sensors other than those mentioned in the preceding examples, including sensors of properties other than temperature and voltage.

The apparatus 100 may further include a control module 140 coupled to the PFNDM 118 to receive a sensed value associated with a particular environmental parameter, including perhaps an operational temperature or an operational voltage. The control module 140 may receive the sensed value during the third period of time when the second clock signal 132 is available to the control module 140 and is locked to the precision reference time base 184. In this second closed-loop configuration, the control module 140 may present the control word 116 to the PFNDM 118 to control the division ratio such that the first clock signal 122 remains locked to the second clock signal 132. No further frequency adjustment or compensation may be necessary, since the first clock signal 122 may be locked to the precision reference time base 184 during the third period of time associated with the second closed-loop configuration.

Alternatively, the control module 140 may receive the sensed value during the second period of time when the precision reference time base 184 is unavailable but when the first clock signal 122 is locked to the second clock signal 132. Or, the control module 140 may receive the sensed value during the first period of time when the second clock signal 132 is unavailable to the calibration module 114.

Some embodiments may compensate for the unavailability of the precision reference time base 184 by selecting or modifying the control word 116 according to the sensed value. Compensation may occur during the first and second periods of time corresponding to the open-loop configuration and to the first closed-loop configuration, respectively. The control word 116 may be selected or modified such as to drive the first clock signal 122 to the estimated frequency. Selection or modification of the control word 116 may also take into consideration historical relationships between the sensed value and a magnitude of the control word 116. Historical values of control words may have been derived by the calibration module 114 during the second or third periods, when the first clock signal 122 was locked to the second clock signal 132 or to both the second clock signal 132 and to the precision reference time base 184. These historical values may be stored and later used to control the division ratio.

The apparatus 100 may also include a look-up table (LUT) 144 coupled to the control module 140 to store a plurality of control words 148. Each one of the plurality of control words 148 may correspond to a value 152 associated with an environmental parameter 156 sensed at a time during the second period or during the third period. That is, a selected one of the plurality of control words 148 may have resulted under operating conditions represented by the value 152 of the environmental parameter 156 at a time when the first clock signal 122 was locked to either the second clock signal 132 or to the precision time base 184. For example, a parameter 158 may comprise a first operating temperature of a value 162 equal to minus twenty degree Celsius. The particular control word 164 may have been derived by the calibration module 114 to maintain the locked condition.

In some embodiments, the control word 168 may be derived as a function of more than one environmental parameter 156. That is, the value 152 may comprise a vector of two or more elements. Each element may comprise a measured value of one environmental parameter 156. For example, both temperature and voltage may be measured at the semiconductor substrate during a particular time or during a particular period. The control word 168 may be derived at or during the particular time or period, and may be associated with the measured temperature and voltage. The value 152 in this example may thus comprise a pair of values (T, V). Other LUT organizational structures may be possible according to the various embodiments.

In some embodiments the control module 140 may be adapted to calculate and store a weighted average of the control word 116 in the LUT 144. The weighted average may include two components. A first component may comprise a currently-derived control word associated with a currently-sensed value of a particular environmental parameter measured while operating in the first or second closed-loop configurations.

A second component may comprise a previously-derived control word. The previously-derived control word may be associated with one or more previously-sensed values of a particular environmental parameter measured while operating in the first or second closed-loop configurations since initializing the LUT 144. Control words corresponding to duplicate previously-sensed values of the particular environmental parameter may not be stored as separate LUT entries, but may additively contribute to the weighted average of a single stored control word 168 associated with the duplicate previously-sensed values.

The weighted average may comprise a quotient, wherein the quotient comprises a first sum of the first component plus the product of the second component multiplied by a weight 170, the first sum divided by a second sum comprising the weight plus one.

$$\text{Weighted Average} = (C1 + (C2*W))/(W+1). \quad [\text{EQ. 1}]$$

Some embodiments may utilize an adaptation rate control parameter $\alpha < 1$. Larger values of $\alpha$ may operate to decrease an influence of the previously-derived control words on a newly-calculated weighted average. The newly-calculated weighted average including $\alpha$ may be expressed as:

$$\text{Weighted Average} = (\alpha*C1 + (1-\alpha)*(C2*W))/((1-\alpha)*W+\alpha), \text{ for } \alpha < 1. \quad [\text{EQ. 2}]$$

The weight 170 associated with the single stored control word 168 may be stored in the LUT 144. Both the single stored control word 168 and the weight 170 may be associated by the LUT 144 with the sensed value 152 of the environmental parameter 156.

It is noted that entries in the LUT 144 in FIG. 1 are illustrative of various embodiments; however the entries may not be representative of any particular embodiment.

Some embodiments may utilize more than one of the LUT 144. Control words corresponding to a particular class of environmental parameters may be stored in a particular LUT, for example. Control words may also be organized into separate LUTs according to whether the control word was derived and stored while the apparatus 100 was in the first or second closed-loop configurations. Some embodiments may utilize LUT formats and organizations different from those described in the foregoing example embodiments. Some embodiments of the apparatus 100 may populate the LUT 144 with default values at a time of initializing the LUT 144.

The apparatus 100 may also include a predictor table 172 coupled to the control module 140 to store a predictor value 174 used by the control module 140 to derive the control word 116. The predictor value 174 may comprise one or more of (a) a parameter relating a frequency associated with the output clock signal 120 of the ring oscillator 106 to an operational temperature; (b) a parameter relating a frequency of the first clock signal 122 to an ambient temperature associated with a device utilizing the first clock signal as a system clock; or (c) a drift factor associated with a frequency difference between the first clock signal 122 and a reference time base selectively coupled to the calibration module 114, among other parameters and factors.

When operating in either the open-loop configuration or in the first closed-loop configuration, the control module 140 may utilize the currently sensed value of a particular environmental parameter to index the corresponding single stored control word 168 from the LUT 144. The control module 140 may transmit the single stored control word 168 directly to the PFNDM 118 as the control word 116 to control a frequency of the first clock signal 122. Alternatively, the control module 140 may utilize the single stored control word 168 as one of several factors to yield the control word 116, other factors including perhaps look-ups from other LUTs and values from the predictor table 172.

The wireless mobile device 110 may be adapted to utilize the first clock signal 122 as a system clock during a sleep-mode period. The wireless mobile device 110 may also be communicatively coupled to the base station 188, and may synchronize the second clock signal 132 to the precision reference time base 184 associated with the base station 188, as previously discussed. The first clock signal 122 may be adapted to synchronize a termination of a sleep-mode period maintained by the wireless mobile device 110 with a paging time period maintained by the base station 188 with which the wireless mobile device 110 may at times be associated. The apparatus 100 may further include an RTC counter module 176 to count the first clock signal 122 to maintain a time-of-day when the second clock signal 132 is unavailable.

In another embodiment, a system 180 may include one or more of the apparatus 100, including a calibration module 114 and a PFNDM 118 as previously described. The calibration module 114 and the PFNDM 118 may be adapted to compensate for a semiconductor process batch-to-batch variation in one or more electrical characteristics associated with each of a plurality of ring oscillators. The electrical characteristics may include a nominal ring oscillator output frequency, a sensitivity of an output frequency to an operational temperature, and a sensitivity of an output frequency to an operational voltage, among others. The system 180 may also include an RTC counter module 176 coupled to the PFNDM to function as an RTC, and a display 190 coupled to the RTC counter module 176 to display the time-of-day.

Any of the components previously described can be implemented in a number of ways, including embodiments in software. Thus, the apparatus 100; ring oscillator 106; wireless mobile device 110; calibration module 114; control words 116, 148, 164, 168; programmable fractional-N divider module (PFNDM) 118; clock signals 120, 122, 132; clock module 130; sleep-mode flag 134; environmental parameter sensors 136A, 136B, 136C; control module 140; look-up table (LUT) 144; values 152, 162; parameters 156, 158; weight 170; predictor table 172; predictor value 174; real-time clock (RTC) counter module 176; system 180; precision reference the time base 184; base station 188; and display 190 may all be characterized as "modules" herein.

The modules may include hardware circuitry, single or multi-processor circuits, memory circuits, software program modules and objects, firmware, and combinations thereof, as desired by the architect of the apparatus 100 and system 180 and as appropriate for particular implementations of various embodiments.

The apparatus and systems of various embodiments can be used in applications other than system and RTC clock implementations in a wireless mobile device to maintain timing while the device is powered off or in sleep mode. Thus, various embodiments of the invention are not to be so limited. The illustrations of apparatus 100 and system 180 are intended to provide a general understanding of the structure of various embodiments. They are not intended to serve as a complete description of all the elements and features of apparatus and systems that might make use of the structures described herein.

Applications that may include the novel apparatus and systems of various embodiments include electronic circuitry used in high-speed computers, communication and signal processing circuitry, modems, single or multi-processor modules, single or multiple embedded processors, data switches, and application-specific modules, including multilayer, multi-chip modules. Such apparatus and systems may be included as sub-components within a variety of electronic systems, such as televisions, cellular telephones, personal computers (e.g., laptop computers, desktop computers, handheld computers, tablet computers, etc.), workstations, radios, video players, audio players (e.g., mp3 players), vehicles, and others. Some embodiments may include a number of methods.

Figure 2:
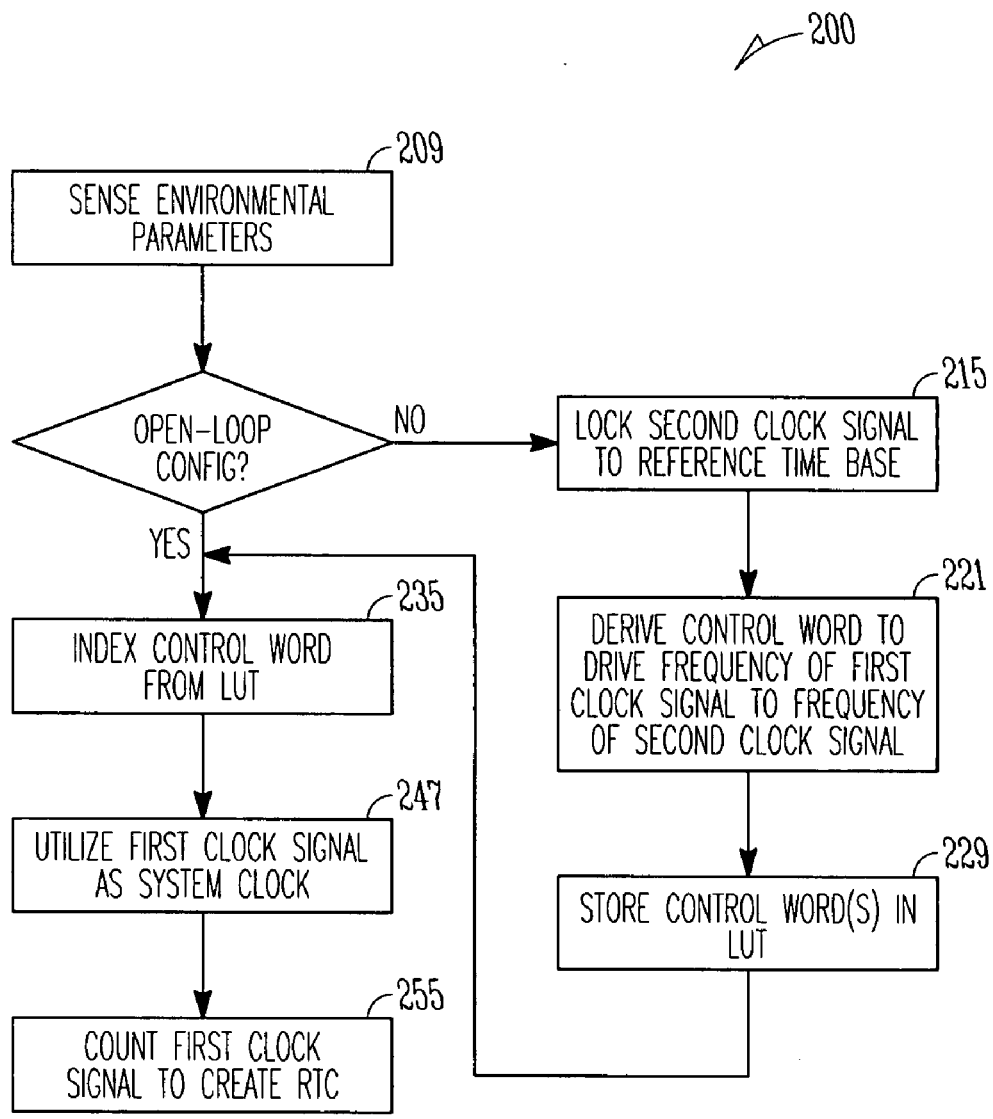
FIG. 2 is a flow diagram illustrating several methods according to various embodiments of the invention.

FIG. 2 is a flow diagram representation illustrating several methods according to various embodiments of the invention. A method 200 may include dividing a frequency associated with an output of a ring oscillator using a PFNDM coupled to the ring oscillator. The ring oscillator may be formed in a semiconductor substrate. A calibration module may be coupled to the PFNDM to select or adjust a division ratio associated with the PFNDM. The division ratio may be selected or adjusted such that an output of the PFNDM comprises a first clock signal of an estimated frequency.

The method 200 may begin at block 209 with sensing one or more environmental parameters associated with a variation in the estimated frequency. Examples of the environmental parameter(s) may include an operational temperature, an operational voltage, or both. The operational temperature may comprise one or more of a temperature sensed at the semiconductor substrate or a temperature sensed adjacent a crystal used to control a frequency of a second clock signal. The second clock signal may comprise a system clock within a wireless mobile device. The first clock signal may at times be frequency-locked to the second clock signal. The operational voltage may comprise an operating voltage associated with the ring oscillator or an operating voltage associated with a clock module used to produce the second clock signal.

The clock module may be communicatively coupled to a reference time base to lock the second clock signal to the reference time base, at block 215. In some embodiments, a wireless mobile device incorporating the clock module and utilizing the first clock signal may be used to communicatively couple the clock module to the reference time base. The reference time base may comprise a clock associated with a base station adapted to communicate with the wireless mobile device.

The method 200 may continue at block 221 with deriving a control word to present to the PFNDM using a calibration module. The control word may select the division ratio such that a frequency difference between the first clock signal and the second clock signal is reduced.

The method 200 may also include storing the control word in a LUT, at block 229. The control word may be associated by the LUT with an environmental parameter also stored in the LUT. The environmental parameter may have been sensed and used to derive the control word at a time when the first and second clock signals were locked to the reference time base. One or more environmental parameters may be stored in this manner over a period of time beginning with an initialization of the LUT. The environmental parameters may include operating temperatures or voltages associated with the ring oscillator, the clock module, or both.

The method 200 may further include indexing and retrieving the control word stored in the LUT, at block 235. The control word may be indexed from the LUT using a currently-sensed value of an environmental parameter. The method 200 may also include using the first clock signal as a system clock in the wireless mobile device during a sleep-mode period, at block 247. The method 200 may conclude at block 255 with counting the first clock signal to create an RTC in the wireless mobile device during at least one of a sleep-mode period or a device power-off period.

It may be possible to execute the activities described herein in an order other than the order described. And, various activities described with respect to the methods identified herein can be executed in repetitive, serial, or parallel fashion.

A software program may be instantiated or launched from a computer-readable medium in a computer-based system to execute functions defined in the software program. Various programming languages may be employed to create software programs designed to implement and perform the methods disclosed herein. The programs may be structured in an object-orientated format using an object-oriented language such as Java or C++. Alternatively, the programs may be structured in a procedure-orientated format using a procedural language, such as assembly or C. The software components may communicate using a number of mechanisms well known to those skilled in the art, such as application program interfaces or inter-process communication techniques, including remote procedure calls. The teachings of various embodiments are not limited to any particular programming language or environment.

Figure 3:
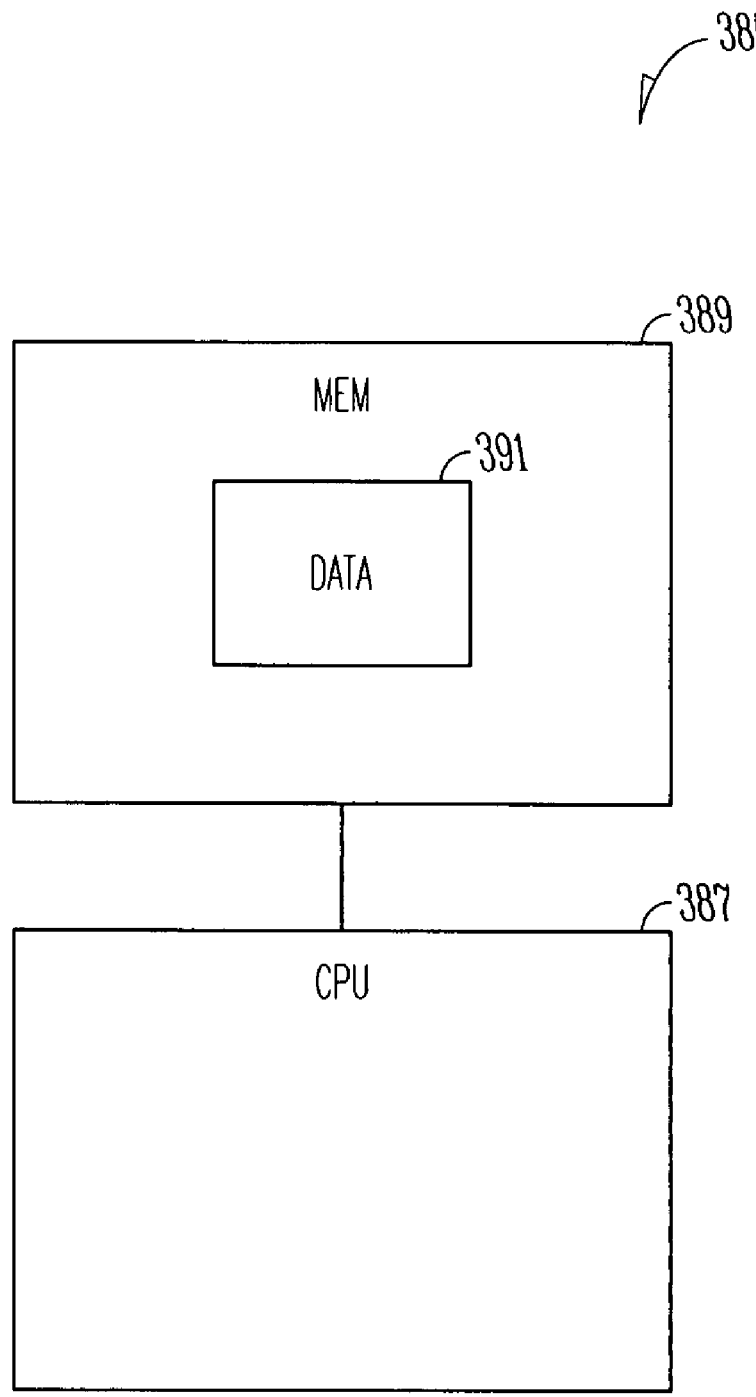
FIG. 3 is a block diagram of an article according to various embodiments of the invention.

FIG. 3 is a block diagram of an article 385 according to various embodiments of the invention. Examples of such embodiments may comprise a computer, a memory system, a magnetic or optical disk, some other storage device, or any type of electronic device or system. The article 385 may include one or more processor(s) such as a central processing unit (CPU) 387 coupled to a machine-accessible medium such as a memory 389 (e.g., a memory including electrical, optical, or electromagnetic elements). The medium may contain associated information 391 (e.g., computer program instructions, data, or both) which, when accessed, results in a machine (e.g., the CPU 387) performing the activities previously described.

The apparatus, systems, and methods disclosed herein may operate to calibrate an on-die oscillator-based clock using one or more clocks of greater precision or stability than the on-die oscillator-based clock. The clock(s) of greater precision or stability may become accessible during the course of operation of an electronic device incorporating the on-die oscillator-based clock. The calibration may enable the electronic device to use the on-die oscillator-based clock as a system clock or as a real-time clock. Cost savings may result, since the on-die oscillator-based clock may be implemented without external components.

Although the inventive concept may include embodiments described in the exemplary context of an 802.xx implementation (e.g., Institute of Electrical and Electronic Engineers Standard 802.11g, Standard for Information technology—Telecommunications and Information Exchange Between Systems—Local and Metropolitan Area Networks—Specific Requirements—Part 11: Wireless LAN Medium Access Control (MAC) and Physical Layer (PHY) Specifications—Amendment 4: Further Higher Data Rate Extension in the 2.4 GHz Band (June 2003); 802.11; 802.11a; 802.11n; 802.11 HT; 802.16; etc.), the claims are not so limited. Embodiments of the present invention may be implemented as part of any wired or wireless system. Examples may also include embodiments comprising multi-carrier wireless communication channels (e.g., OFDM, DMT, etc.) such as may be used within a wireless personal area network (WPAN), a wireless local area network (WLAN), a wireless metropolitan are network (WMAN), a wireless wide area network (WWAN), a cellular network, a third generation (3G) network, a fourth generation (4G) network, a universal mobile telephone system (UMTS), and like communication systems, without limitation.

The accompanying drawings that form a part hereof show, by way of illustration and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein individually or collectively by the term "invention" merely for convenience and without intending to voluntarily limit the scope of this application to any single invention or inventive concept, if more than one is in fact disclosed. Thus, although specific embodiments have been illustrated and described herein, any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted to require more features than are expressly recited in each claim. Rather, inventive subject matter may be found in less than all features of a single disclosed embodiment. Thus the following claims are hereby incorporated into the Detailed Description, with each claim standing on its own as a separate embodiment.

What is claimed is:

1. An apparatus, including:
   a ring oscillator formed in a semiconductor substrate;
   a programmable fractional-N divider module (PFNDM) coupled to the ring oscillator to divide an output signal associated with the ring oscillator; and
   a calibration module coupled to the PFNDM to select a division ratio associated with the PFNDM such that an output of the PFNDM comprises a first clock signal of an estimated frequency.

2. The apparatus of claim 1, wherein a deviation in a frequency of an output signal associated with the ring oscillator over an operational range of temperature at the semiconductor substrate is less than about 50%.

3. The apparatus of claim 1, further including:
   a clock module coupled to the calibration module to be used as a timing reference input to the division ratio control operation.

4. The apparatus of claim 3, wherein the division ratio is selected to be a function of a frequency difference between the first clock signal and a second clock signal comprising an output of the clock module, the function selected to drive a frequency associated with the first clock signal toward a frequency associated with the second clock signal.

5. The apparatus of claim 4, wherein the second clock signal is adapted to be frequency-locked to a precision reference time base.

6. The apparatus of claim 4, further including:
   an environmental parameter sensor coupled to the calibration module to sense a value of an environmental parameter related to the frequency of the first clock signal.

7. The apparatus of claim 6, wherein the environmental parameter sensor comprises at least one of a first temperature sensor coupled to the ring oscillator to sense the first temperature at the semiconductor substrate associated with the ring oscillator or a second temperature sensor coupled to the second clock to sense a second temperature associated with a frequency-determining element coupled to the calibration module, the environmental parameter sensor to provide an input to the division ratio control operation.

8. The apparatus of claim 6, further including a control module coupled to the PFNDM capable of:
   receiving the sensed value of the environmental parameter during a period of time when the first clock signal is locked to the precision reference time base and to present a control word to the PFNDM to control the division ratio such as to maintain the locked condition; or capable of:
   receiving the sensed value of the environmental parameter during a period of time when the first clock signal is not locked to the precision reference time base and to modify the control word according to the sensed value of the environmental parameter such as to drive the first clock signal to the estimated frequency.

9. The apparatus of claim 8, further including:
a look-up table (LUT) coupled to the control module to store a plurality of control words, each control word corresponding to a value of the environmental parameter sensed while the first clock signal was locked to at least one of the second clock signal and the precision reference time base.

10. The apparatus of claim 9, wherein the environmental parameter comprises at least one of an operational temperature or an operational voltage.

11. The apparatus of claim 9, wherein the control module is adapted to calculate and store a weighted average of the control word in the LUT, the weighted average comprising at least two components, a first component comprising a currently-derived control word associated with a currently-sensed value of the environmental parameter measured while operating in a closed-loop configuration, and a second component comprising previously-derived control words associated with previously-sensed values of the environmental parameter measured while operating in the closed-loop configuration and since initializing the LUT, and wherein control words corresponding to duplicate previously-sensed values of the environmental parameter are not stored as separate LUT entries, but additively contribute to the weighted average of a single stored control word associated with the duplicate previously-sensed values.

12. The apparatus of claim 11, wherein a weight associated with the single stored control word is stored in the LUT and is associated by the LUT with the sensed value of the environmental parameter, and wherein the single stored control word is associated by the LUT with the sensed value of the environmental parameter.

13. The apparatus of claim 8, further including:
a predictor table coupled to the control module to store a predictor value used by the control module to derive the control word.

14. The apparatus of claim 13, wherein the predictor value comprises at least one of a parameter relating an output frequency of the ring oscillator to an operational temperature, a parameter relating a frequency of the first clock signal to an ambient temperature associated with a device utilizing the first clock signal as a system clock, or a drift factor associated with a frequency difference between the first clock signal and a reference time base selectively coupled to the control module.

15. The apparatus of claim 1, further including:
a wireless mobile device to utilize the first clock signal as a system clock during a sleep-mode period.

16. The apparatus of claim 15, further including:
an RTC counter module to count the first clock signal to maintain a time-of-day when the second clock is unavailable.

17. The apparatus of claim 1, wherein the first clock signal is adapted to synchronize a termination of a sleep-mode period maintained by the wireless mobile device with a paging time period maintained by a base station with which the wireless mobile device is associated.

18. A system, including:
a ring oscillator formed in a semiconductor substrate;
a programmable fractional-N divider module (PFNDM) coupled to the ring oscillator to divide an output signal associated with the ring oscillator; and
a calibration module coupled to the PFNDM to select a division ratio associated with the PFNDM such that an output of the PFNDM comprises a first clock signal of an estimated frequency;
a real-time clock (RTC) counter module coupled to the PFNDM; and
a display coupled to the PFNDM to display a time-of-day.

19. The system of claim 18, wherein the calibration module and the PFNDM are adapted to compensate for a semiconductor process batch-to-batch variation in at least one electrical characteristic associated with each of a plurality of ring oscillators.

20. The system of claim 19, wherein the at least one electrical characteristic comprises at least one of a nominal ring oscillator output frequency, a sensitivity of the output frequency to an operational temperature, or a sensitivity of the output frequency to an operational voltage.

21. A method, including:
dividing a frequency associated with an output of a ring oscillator formed in a semiconductor substrate using a programmable fractional-N divider module (PFNDM) coupled to the ring oscillator; and
selecting a division ratio associated with the PFNDM using a calibration module coupled to the PFNDM, wherein the division ratio is selected to yield an output of the PFNDM comprising a first clock signal of an estimated frequency.

22. The method of claim 21, further including:
sensing an environmental parameter associated with a variation in the estimated frequency.

23. The method of claim 22, wherein the environmental parameter comprises at least one of a temperature sensed at the semiconductor substrate or a temperature sensed adjacent a crystal used to control a second clock signal, and wherein the operational voltage comprises at least one of an operating voltage associated with the ring oscillator or an operating voltage associated with a clock module used to produce the second clock signal.

24. The method of claim 23, further including:
deriving a control word to present to the PFNDM, the control word adapted to select the division ratio such that a frequency difference between the first clock signal and the second clock signal is reduced.

25. The method of claim 24, further including:
communicatively coupling the clock module to a reference time base to lock the second clock signal to the reference time base, wherein the second clock signal comprises a system clock within a wireless mobile device, and wherein the reference time base comprises a clock associated with a base station adapted to communicate with the wireless mobile device.

26. The method of claim 25, further including:
storing the control word in a look-up table (LUT), wherein the control word is associated by the LUT with an environmental parameter stored in the LUT and used to derive the control word at a time when at least one of the first clock signal or the second clock signal was locked to the reference time base.

27. The method of claim 26, further including:
indexing and retrieving the control word from the LUT using a currently-sensed value of the environmental parameter as an index during a time when at least one of the first clock signal or the second clock signal is not locked to the reference time base.

28. An article including a machine-accessible medium having associated information, wherein the information, when accessed, results in a machine performing:
dividing a frequency associated with an output of a ring oscillator formed in a semiconductor substrate using a programmable fractional-N divider module (PFNDM) coupled to the ring oscillator; and selecting a division ratio associated with the PFNDM using a calibration module coupled to the PFNDM, wherein the division ratio is selected to yield an output of the PFNDM comprising a first clock signal of an estimated frequency.

29. The article of claim 28, wherein the information, when accessed, results in a machine performing:

utilizing the first clock signal as a system clock in a wireless mobile device during a sleep-mode period.

30. The article of claim 28, wherein the information, when accessed, results in a machine performing:

counting the first clock signal to create a real-time clock in a wireless mobile device during at least one of a sleep-mode period or a device power-off period.

* * * * *